United States Patent
Lin et al.

(10) Patent No.: US 7,335,929 B2
(45) Date of Patent: Feb. 26, 2008

(54) TRANSISTOR WITH A STRAINED REGION AND METHOD OF MANUFACTURE

(75) Inventors: Chun-Chieh Lin, Hsin-Chu (TW);
Wen-Chin Lee, Hsin-Chu (TW);
Yee-Chia Yeo, Singapore (SG);
Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 130 days.

(21) Appl. No.: 10/967,917

(22) Filed: Oct. 18, 2004

(65) Prior Publication Data

US 2006/0081875 A1 Apr. 20, 2006

(51) Int. Cl.
*H01L 31/00* (2006.01)

(52) U.S. Cl. .......... 257/192; 257/77; 257/616

(58) Field of Classification Search .......... 257/192, 257/194, 77, 616, 382, 410
See application file for complete search history.

(56) References Cited

U.S. PATENT DOCUMENTS

| | | | |
|---|---|---|---|
| 5,019,882 A | 5/1991 | Solomon et al. | |
| 5,847,419 A * | 12/1998 | Imai et al. | 257/192 |
| 6,004,137 A | 12/1999 | Crabbé et al. | |
| 6,291,321 B1 | 9/2001 | Fitzgerald | |
| 6,429,061 B1 | 8/2002 | Rim | |
| 6,621,131 B2 | 9/2003 | Murthy et al. | |
| 6,680,496 B1 * | 1/2004 | Hammond et al. | 257/192 |
| 6,825,507 B2 * | 11/2004 | Aihara | 257/192 |

OTHER PUBLICATIONS

Thompson, S., et al., "A 90 nm Logic Technology Featuring 50nm Strained Silicon Channel Transistors, 7 Layers of Cu Interconnects, Low k ILD, and 1 um² SRAM Cell," IEDM, Dec. 2002, pp. 61-64.
Welser, J., et al., "NMOS and PMOS Transistors Fabricated in Strained Silicon/Relaxed Silicon-Germanium Structures," IEDM, 1992, pp. 1000-1002, Dec. 1992.
Shimizu, A., et al., "Local Mechanical-Stress Control (LMC): A New Technique for CMOS-Performance Enhancement," IEDM 2001, pp. 433-436, Dec. 2001.

* cited by examiner

*Primary Examiner*—Mark V. Prenty
(74) *Attorney, Agent, or Firm*—Slater & Matsil, L.L.P.

(57) ABSTRACT

A transistor structure comprises a channel region overlying a substrate region. The substrate region comprises a first semiconductor material with a first lattice constant. The channel region comprises a second semiconductor material with a second lattice constant. The source and drain regions are oppositely adjacent the channel region and the top portion of the source and drain regions comprise the first semiconductor material. A gate dielectric layer overlies the channel region and a gate electrode overlies the gate dielectric layer.

36 Claims, 14 Drawing Sheets

TRANSISTOR WITH A STRAINED REGION AND METHOD OF MANUFACTURE

TECHNICAL FIELD

The present invention relates generally to semiconductor devices, and more particularly to a transistor with a strained region and method of manufacturing same.

BACKGROUND

Complementary metal-oxide-semiconductor (CMOS) technology is a dominant semiconductor technology used for the manufacture of ultra-large scale integrated (ULSI) circuits today. Size reduction of the metal-oxide-semiconductor field-effect transistor (MOSFET) has provided significant improvement in the speed, performance, circuit density, and cost per unit function of semiconductor chips over the past few decades. Significant challenges are faced when CMOS devices are scaled into the sub-100 nm regime. An attractive approach for additional improvement of CMOS transistor performance exploits strain-induced band-structure modification and mobility enhancement to increase transistor drive current. Enhanced electron and hole mobilities may improve the drive currents of N-channel and P-channel MOSFETs, respectively. Enhanced electron and hole mobilities may be achieved by having silicon (Si) or a silicon alloy such as silicon germanium (SiGe) or silicon carbon (SiC) in the channel region under strain. For silicon transistors with source-to-drain direction oriented along a [110] crystal direction, silicon channel under tensile strain enhances electron mobility and Si under compressive strain enhances hole mobility.

Strained channel transistors known in the art have materials known as stressors. The term stressor may define a semiconductor material that imposes stress on another semiconductor material. FIGS. 1a-1c show regions in which stressors are commonly formed. An underlying substrate region 102 shown in FIG. 1a may comprise a stressor. As shown in FIG. 1b, source and drain regions 108 may comprise a material that stresses the channel from adjacent sides. Materials in the channel etch stop layer 114 may impose a stress on the channel region 110 from above, as shown in FIG. 1c.

Bi-directional arrows in the channel region 110 of FIGS. 1a-1c show that the strain imposed on the channel region 110 may be tensile or compressive. Compressing a material in a channel region of a transistor typically enhances hole flow and may improve P-channel transistor performance. Tensile stress in a channel region of a transistor typically enhances electron flow and may improve N-channel transistor performance.

FIG. 2 shows a strained channel transistor 120 formed in a material layer structure 122. The material layer structure includes a buried oxide (BOX) layer 123. A Si layer 128 covers the BOX layer 123. A graded SiGe layer 124 overlies the Si layer 128. A relaxed SiGe layer 130 covers the graded SiGe layer 124 and acts as a stressor to the overlying strained Si layer 126. Source and drain regions 132 and a channel region 134 are in the strained Si layer 126. As shown in FIGS. 3a and 3b, the thick relaxed SiGe layer 130 imposes a biaxial tensile strain on the thin Si layer 126. The relaxed SiGe layer 130 stretches the strained Si layer 126 along a width and a length of the channel region 134.

Referring to FIG. 2, the strained channel transistor 120 formed within the material layer structure 122 includes the graded SiGe layer 124. The graded SiGe layer 124 may increase manufacturing cost, in part due to the time required to grow multiple layers of Si with increasing concentrations of germanium (Ge). Another limitation of having a SiGe layer in the strained channel transistor 120 may be lattice dislocations in the stressed layer. As shown in FIG. 2, dislocations 136 in the SiGe layer may propagate to the strained Si layer 126, possibly causing faulty or poor transistor 120 performance, such as increased junction leakage.

Subsequent fabrication steps, including thermal processing steps involved in forming the transistor 120 in a strained Si layer 126, may cause the amount of strain in the strained Si layer 126 to diminish, reducing strain in the channel region 134. Reduced strain in the channel region 134 may result in decreased transistor 120 performance.

In U.S. Pat. No. 6,621,131 B2, entitled "Semiconductor Transistor Having a Stressed Channel," Muthy et al. disclose a strained channel transistor 140 shown in FIG. 4a. SiGe formed in the source and drain regions 142 impose a stress on Si material in the channel 144 from adjacent sides. Murthy et. al. recognize, however, that the device of FIG. 4a results in non-uniform strain as shown in FIG. 4b. Lines 146 in FIG. 4b indicate direction of stress in the channel 144 between the source and drain regions 142. A more dense spacing between the lines 146 indicates a larger stress and a larger spacing between the lines 146 indicates a smaller stress. FIG. 4b shows a decrease in strain related to the depth D and the width $W_c$ of the channel 144.

Various shortcomings in the prior art can be overcome and advantageous features can be obtained by the provision of a strained channel transistor having a stressed channel with stressing material below as well as on adjacent sides of the channel region.

SUMMARY OF THE INVENTION

In one aspect, the present invention provides for a transistor structure comprising a channel overlying a substrate region. The substrate region comprises a first semiconductor material with a first lattice constant. The channel comprises a second semiconductor material with a second lattice constant. The source and drain regions are oppositely adjacent the channel and the top portion of the source and drain regions comprise the first semiconductor material. A gate dielectric layer overlies the channel and a gate electrode overlies the gate dielectric layer.

In another aspect, the present invention provides for a transistor structure comprising a channel overlying a substrate region, and the substrate region comprises a first semiconductor material with a first lattice constant. The channel comprises a second semiconductor material with a second lattice constant. Source and drain regions are formed oppositely adjacent the channel. The top portion of the source and drain regions comprise a third semiconductor material with a third lattice constant and a gate dielectric layer overlies the channel. A gate electrode overlies the gate dielectric layer.

In another aspect, the present invention provides for a first method of forming a strained channel transistor. A substrate is provided comprising a first semiconductor material forming a strained region on the substrate. The strained region comprises a second semiconductor material forming a gate stack on a portion of the strained region. A recess is formed in portions of the strained region not covered by the gate stack. A third semiconductor material is formed in the recess, forming source and drain regions.

In another aspect, the present invention provides for a second method of forming a strained channel transistor. A substrate is provided comprising a first semiconductor material forming a strained region on the substrate, said strained region comprising a second semiconductor material. A gate stack is formed on a portion of the strained region. A recess is formed in a portion of the strained region not covered by the gate stack. A third semiconductor material is formed in the recess.

An advantage of the present invention is improved transistor performance. This can be achieved by controlling the amount of strain in the channel. By reducing the amount of strain relief in the channel after stressed channel formation, a transistor may exhibit improved performance.

A further advantage of the present invention is that it provides a simple, cost effective method of manufacture. The use of existing manufacturing steps may reduce manufacturing cost and improve yield.

Another advantage of the present invention is that it includes a method of manufacturing strained N-channel and P-channel transistors in close proximity with little or no additional cost or complexity. This can be particularly advantageous in CMOS high-density integrated circuits.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the present illustrative embodiments are discussed in detail below. It should be appreciated, however, that the present invention provides many applicable inventive concepts that can be embodied in a wide variety of specific contexts. The specific embodiments discussed herein are merely illustrative of specific ways to make and use the invention, and do not limit the scope of the invention.

Figure 1A:
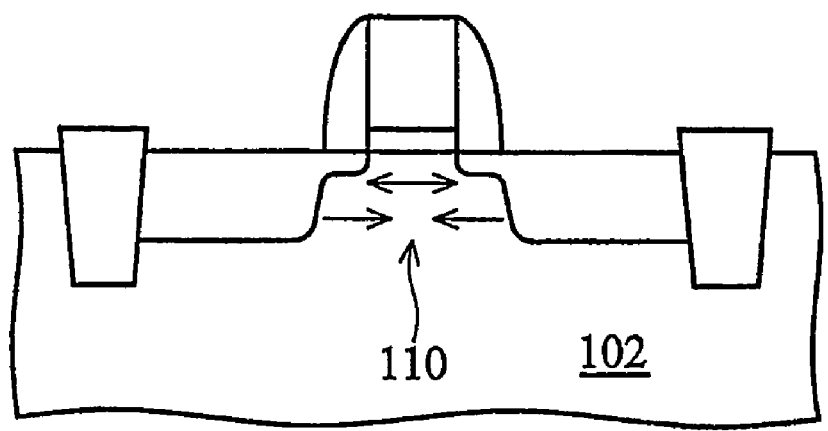
FIGS. 1a-1c show prior art strained transistors.
Figure 1B:
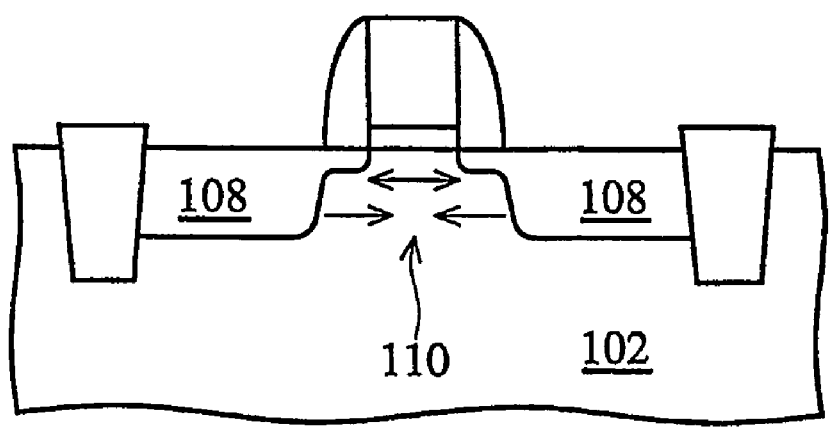
Figure 1C:
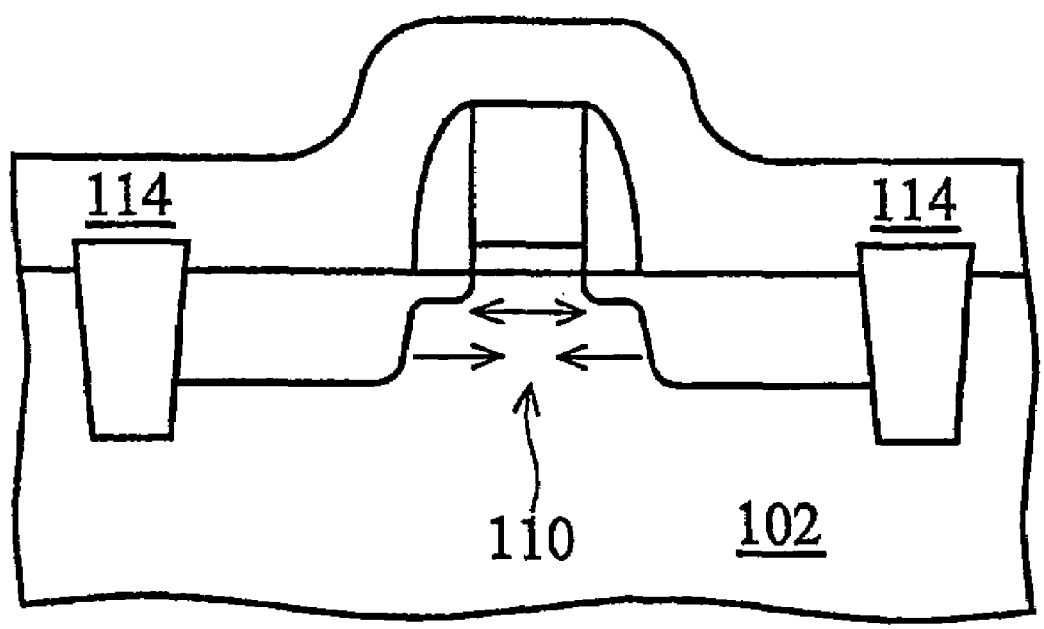
Figure 2:
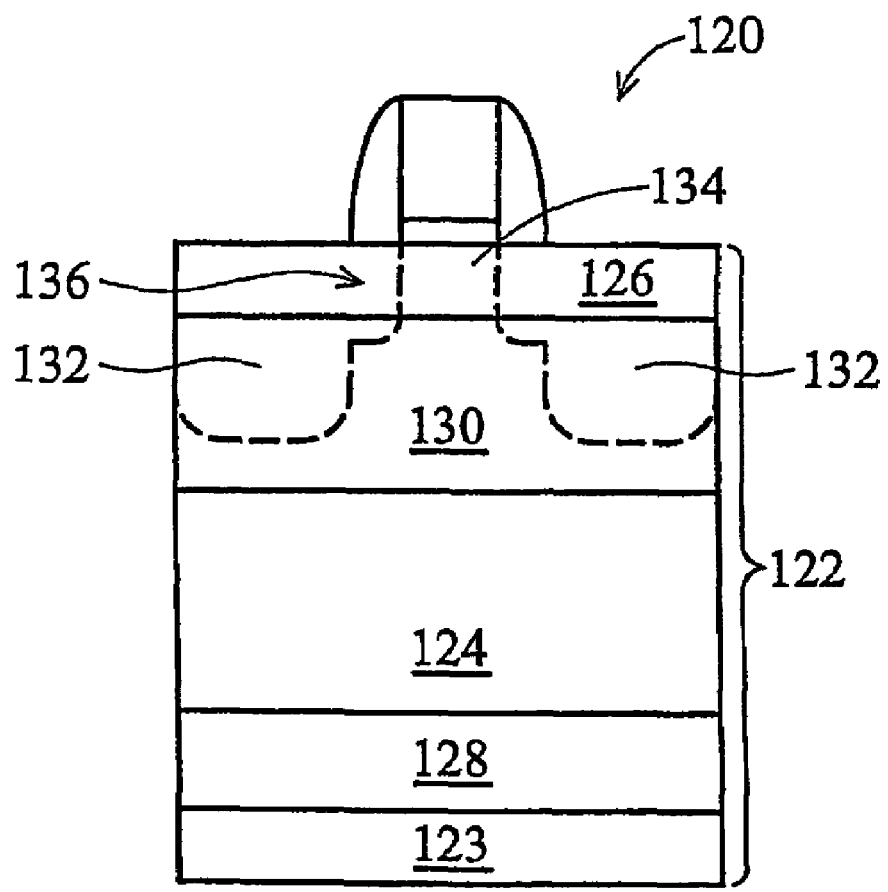
FIG. 2 shows a prior art strained channel transistor with a graded layer.
Figure 3A:
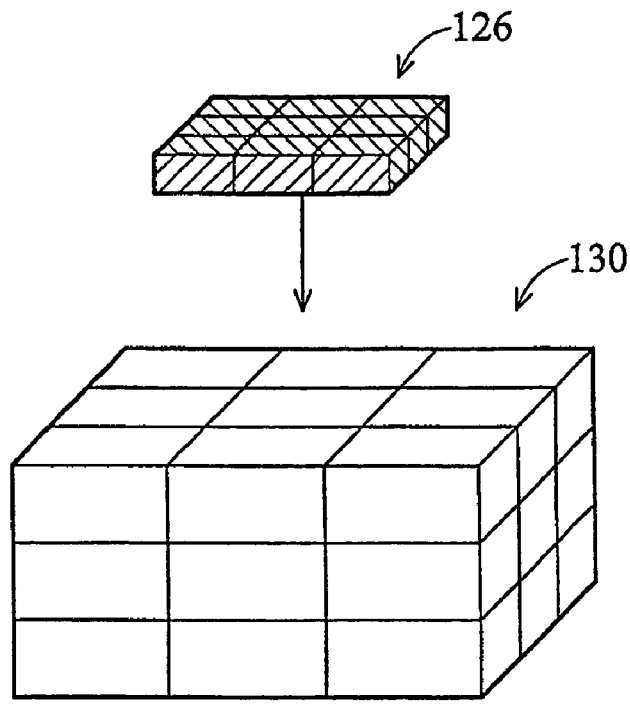
FIGS. 3a and 3b show an example of a substrate where biaxial tensile strain is induced in a silicon layer.
Figure 3B:
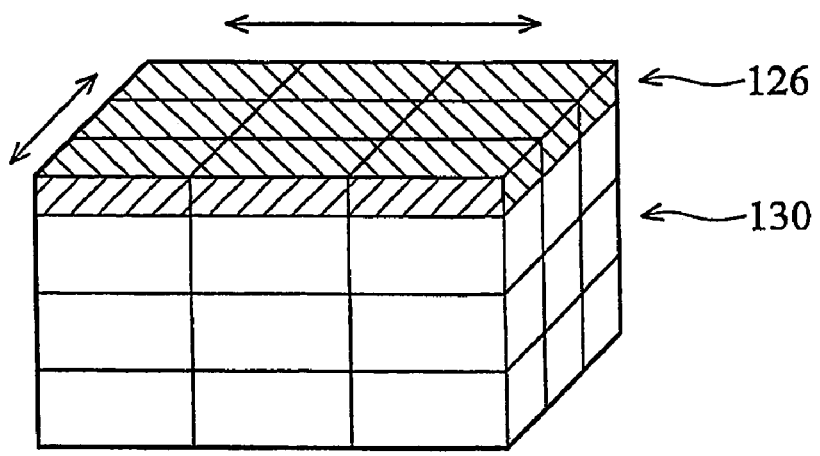
Figure 4A:
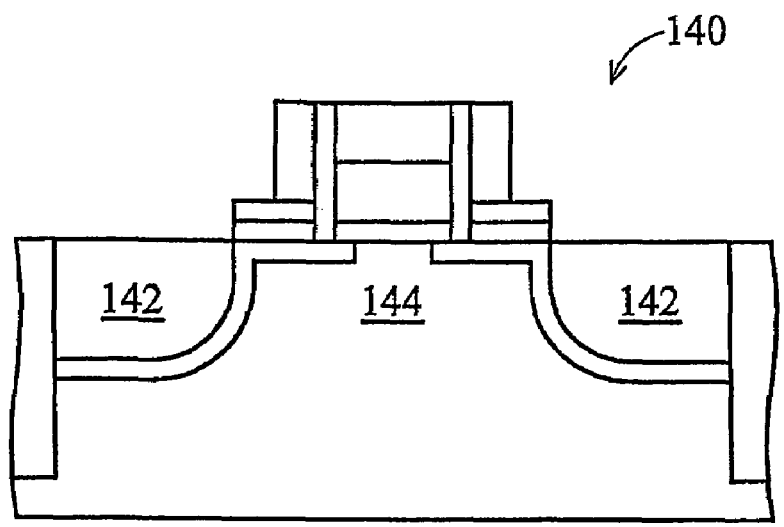
FIGS. 4a and 4b show a transistor having stressors on adjacent sides of a channel.
Figure 4B:
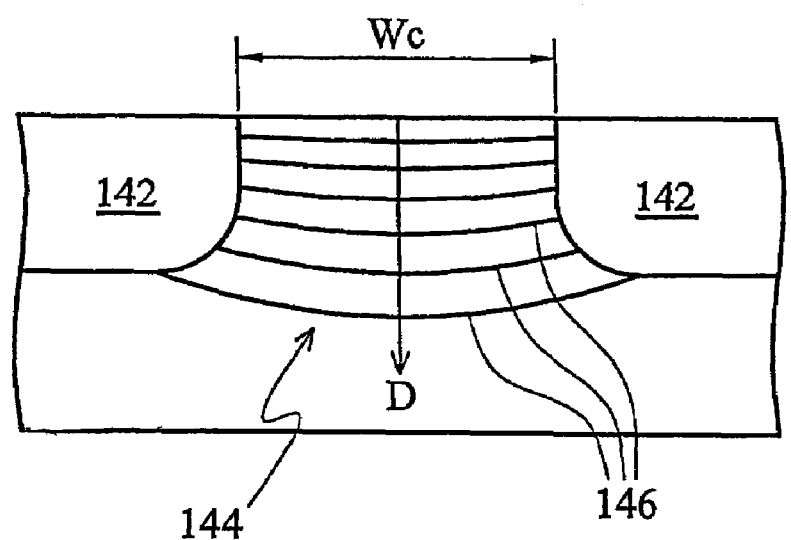
Figure 5A:
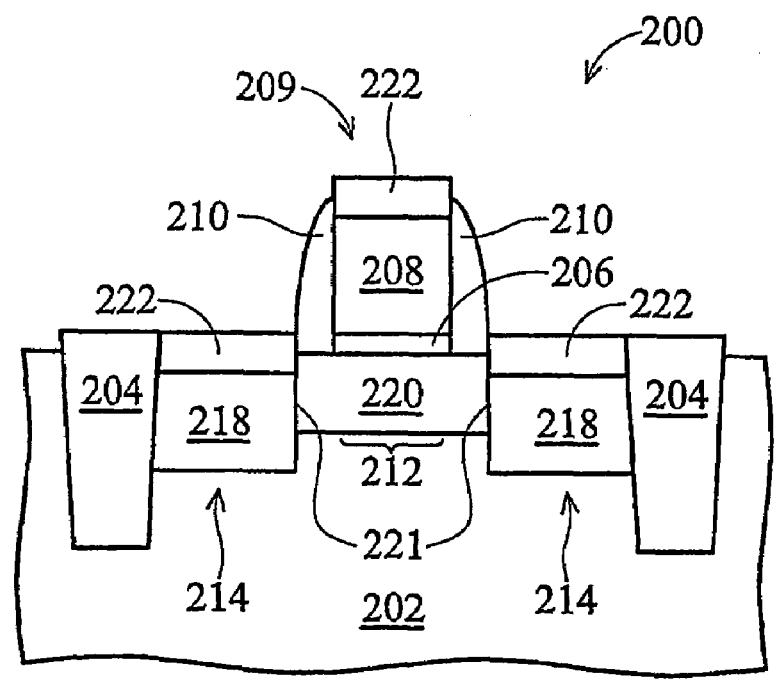
FIGS. 5a and 5b show illustrative embodiments of the present invention.

A first illustrative embodiment of the present invention is shown in FIG. 5a. A strained channel transistor 200 includes a substrate region 202 that is preferably over a silicon-on-insulator (SOI) substrate or a strained-silicon-on-insulator (SSOI) substrate. However, embodiments of the present invention may have any suitable substrate, including a bulk silicon substrate. Embodiments of the present invention may have a heterogeneous multi-layer structure that may include graded layers. Embodiments of the present invention are not restricted to any particular substrate layer structure, however.

The strained channel transistor 200 is isolated with an isolation structure 204, shown in FIG. 5a as a shallow trench isolation (STI) structure. The STI structure 204 is preferably about 100 angstroms to about 6000 angstroms thick, and more preferably about 3000 angstroms to about 4000 angstroms. Other embodiments of the present invention include isolation structures such as any of a number of variations of local oxidation of silicon (LOCOS), such as recessed, semi-recessed LOCOS, through the formation of silicon "islands" on an insulating substrate, and the like.

The first illustrative embodiment is shown with a gate dielectric 206, a gate electrode 208 and spacers 210. The gate dielectric 206 overlies a channel region 212 and may comprise silicon dioxide or silicon oxynitride, as well as high-permittivity materials such as $Al_2O_3$, $HfO_2$, $ZrO_2$, HfON, $HfSiO_4$, $ZrSiO_4$ or $La_2O_3$, or a combination thereof, for example. The gate dielectric 206 may preferably have a relative permittivity greater than about 5, however it is understood that the relative permittivity may be higher or lower. The gate dielectric 206 thickness may range from about 3 to about 100 angstroms. The gate electrode 208 overlies the gate dielectric 206 and may include materials such as poly-crystalline silicon, polycrystalline silicon germanium, a metal, a metal nitride, a metal silicide, or combinations thereof.

Spacers 210 are formed adjacent the gate dielectric 206 and gate electrode 208. The combination of the gate dielectric 206, gate electrode 208 and spacers 210 comprise a gate stack 209. In one example, the spacers 210 may be formed by chemical vapor deposition of a dielectric material, e.g., silicon oxide or silicon nitride, followed by an anisotropic etching of the dielectric material to form simple spacers. The spacers 210 may be composite spacers having an oxide-nitride-oxide (ONO) layer structure. A composite spacer may comprise a dielectric liner and a spacer body. The dielectric liner may be formed by the deposition of a dielectric liner material, e.g., silicon oxide, and the spacer body material, e.g. silicon nitride, followed by an anisotropic etch using reactive ion etching. In another embodiment, the liner may be an oxide and the spacer body may be a nitride.

The first embodiment comprises three regions that define the boundaries of materials used to create strain in the channel region 212. The first and second regions 218 overlie the substrate region 202 and are oppositely adjacent the channel region 212. The first and second regions 218 are preferably between about 100 angstroms and about 1000 angstroms thick, and more preferably about 200 angstroms to about 400 angstroms. A third region 220 underlies the gate stack 209 and is abutted to the first and second regions 218 at junctions 221. The junctions 221 are substantially aligned with the outer edges of the spacers 210. The third region 220 also abuts the underlying substrate 202 and occupies the channel region 212. The third region 220 is preferably between about 100 and about 160 angstroms thick, however, the third region 220 may be any desired thickness.

The first embodiment shown in FIG. 5a also includes source/drain regions 214 spaced adjacent to the channel region 212. The channel region 212 may have a thickness in the range of about 10 to about 1000 angstroms. The length of the channel region 212 may be between about 50 angstroms to about 5000 angstroms, but any desirable channel length may be used.

It is important to note that while the first and second regions 218 occupy a portion of the source/drain regions 214, they are not necessarily co-terminus. One skilled in the art will recognize that the source/drain regions 214 may extend below first and second regions 218. In such a case, only the top portions of the source/drain regions 214 will comprise the material of the first and second regions 218. In other embodiments, the source/drain regions 214 only extend partly through the first and second regions 218. Similarly, the third region 220, although defined in a similar manner to the channel region 212 is not necessarily the same as the channel region 212. In some illustrative embodiments, some or all of the regions are similar to the channel region 212 and source/drain regions 214. However, the first, second 218 and third 220 regions serve to define areas having semiconductor materials with varying lattice constants that affect the stress in the channel region 212. In contrast, the source/drain 214 and channel regions 212 are defined relative to dopant type and dopant density.

Materials used in the first, second 218 and third 220 regions, as well as the underlying substrate region 202 include silicon germanium (SiGe or $Si_{1-x}Ge_x$), silicon (Si), and silicon carbon (SiC, $Si_{1-y}C_y$), for example. $Si_{1-x}Ge_x$ may have a germanium mole fraction x ranging between about 0.1 and about 0.9 and is preferably about 0.2 to 0.6. Silicon Carbon ($Si_{1-y}C_y$) may have a carbon mole fraction y in the range of about 0.005 to about 0.05 and is preferably 0.01 to 0.04. It should be noted that the materials discussed are merely illustrative and do not limit the scope of the invention.

The magnitude of the tensile and compressive strain under which the above mentioned materials are placed may be in the range of about 0.1% to about 2%, and is preferably about 1%.

Epitaxially grown silicon occupies the third region 220. The silicon is confined on multiple sides by SiGe in the first, second 218 and substrate 202 regions. The confining SiGe imposes a compressive stress on the silicon in the channel region 212, improving the flow of holes through the strained silicon and across the channel region 212. Improved hole flow results in improved transistor performance, including higher drive current.

Figure 5B:
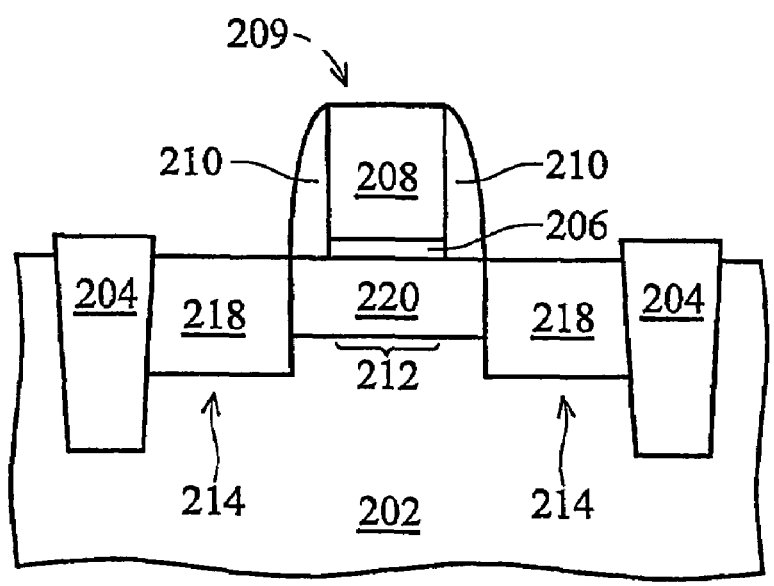

FIG. 5a shows conductive regions 222 in the source/drain regions 214 and in the gate electrode 208. The conductive regions 222 are formed using a conductive material such as metal, a metallic silicide, or a metallic nitride. However, other embodiments of the present invention do not necessarily include conductive regions 222. For example, FIG. 5b shows the strained channel transistor 200 of FIG. 5a without conductive regions 222.

Controlling the amount of strain in the channel region 212 is an advantage of the first illustrative embodiment shown in FIG. 5a. Improved control of the amount of strain in the channel region 212 of the transistor 200 is achieved by stressing the channel region 212 from multiples sides. The channel region 212 is stressed from the first and second regions 218 on adjacent sides and from the underlying substrate 202.

Greater control of the amount of strain in the channel region 212 is further achieved by the confinement of the silicon in the third region 220. Confining the silicon in the third region 220 on adjacent sides and underneath with SiGe limits relaxation in the strained channel region 212 during subsequent manufacturing steps.

Another embodiment of the present invention is an NMOS transistor (not shown) similar to the transistor 200 of FIG. 5a. However, the material in the substrate region 202 and first and second regions 218 is Si and the material in the third region 220 is SiGe. The source/drain regions are doped N-type. The silicon imposes a tensile stress on the silicon germanium in the channel region 212, thereby improving the flow of electrons across the channel region 212. Improved electron flow results in improved transistor performance, including higher drive current.

Yet another embodiment having an NMOS transistor (not shown) with source/drain regions doped N-type is also similar to the transistor 200 shown in FIG. 5a. The NMOS has SiGe in the substrate region 202. The third region 220 comprises Si and the first and second regions 218 have a third material with a lattice constant greater than Si, such as SiGe. A compressive stress is exerted on the silicon in the third region 220 by the SiGe from underneath and by the third material in the first and second regions 218 on adjacent sides. The Ge concentration in the third material in the first and second regions 218 may be different from the Ge concentration in the substrate 202.

Figure 6:
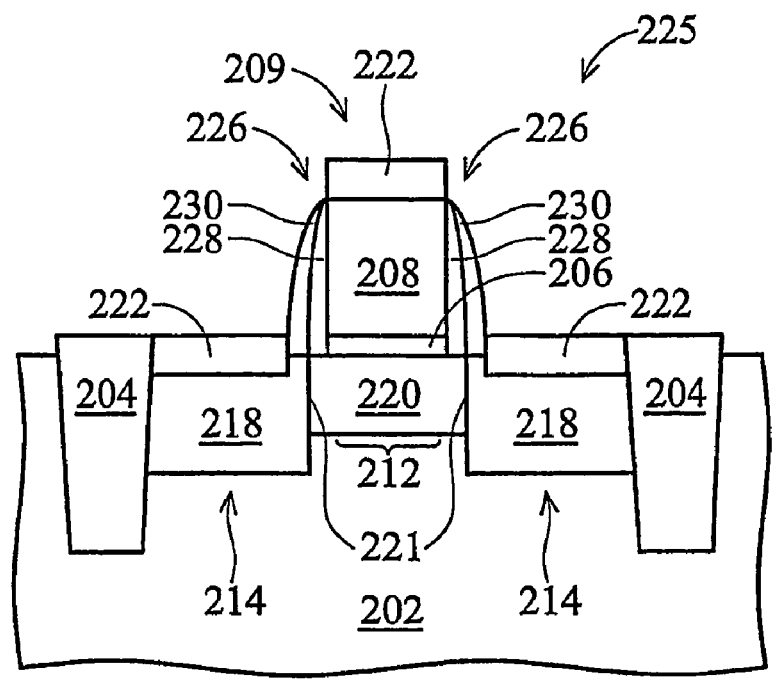
FIG. 6 shows another illustrative embodiment of the present invention.

In a second illustrative embodiment shown in FIG. 6, the semiconductor material in the substrate region 202 and first and second regions 218 of a NMOS strained channel transistor 225 is silicon carbon (SiC, $Si_{1-y}C_y$). Silicon in the third region 220 experiences compressive stress from the confining SiC. The compressive strain in the channel region 212 enhances electron flow, improving the NMOS transistor 225 performance. The third region 220 abuts the first and second regions 218 at vertical junctions 221 between the outer and inner edges of composite spacers 226. The third region 220 is positioned under the gate dielectric 206 and portions of the composite spacers 226. The spacers 226 are composite spacers with a liner 228 and a spacer body 230.

Another embodiment is a transistor (not shown) similar to the NMOS transistor 225 of FIG. 6, however the transistor is a PMOS with source/drain regions 214 doped P-type. The material in the substrate region 202 and first and second regions 218 consists of Si and the third region 220 has a SiC material. The strain on the channel region 212 is tensile, improving hole flow across the channel region 212 and improving transistor drive current.

Yet another embodiment having a PMOS transistor (not shown) with P-type source/drain regions is similar to the transistor 225 shown in FIG. 6. The transistor 225 has SiC in the substrate, Si in the third region 220 and a third material having a lattice constant less than Si in the first and second regions 218. The strain on the channel region 212 is compressive, improving electron flow across the channel region 212 and improving transistor drive current.

Figure 7:
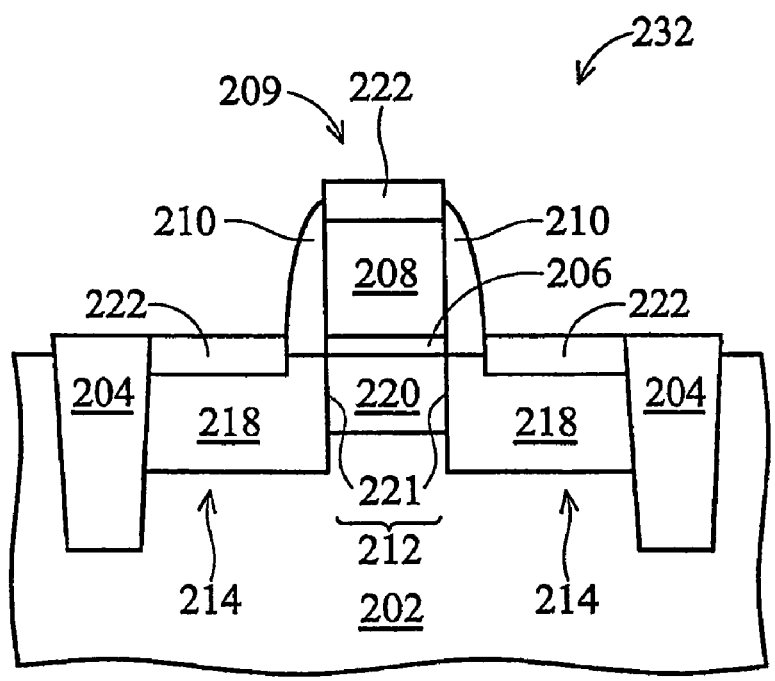
FIG. 7 shows yet another illustrative embodiment of the present invention.

In a third illustrative embodiment of the present invention, the semiconductor material in the substrate region 202 of a PMOS strained channel transistor 232 shown in FIG. 7 is Si. The material in the third region 220 is SiC. A material in the first and second regions 218 is a material with a lattice constant greater than the lattice constant of SiC. The third region 220 abuts the first and second regions 218 at junctions 221 vertically aligned with edges of the gate dielectric 206. The third region 220 is under the gate dielectric 206, and is under a minimal portion of the spacers 210.

Another embodiment has an NMOS transistor (not shown) similar to the strained channel transistor 232 of FIG. 7, however the source/drain regions are doped N-type. The third region 220 comprises SiGe, and the first and second regions 218 comprise a third material with a lattice constant lower than the lattice constant of SiGe. The strain on the channel region 212 is tensile, improving electron flow across the channel region 212 and improving transistor 232 drive current.

In all embodiments, the material in the third region 220 has a different lattice constant than the lattice constant of the confining material in the first and second regions 218 and substrate 202. In an embodiment in which the first and second regions 218 have a material with a larger lattice constant than the material in the third region 220, the material in the substrate region 202 will also have a larger lattice constant than the material in the third region. In an embodiment in which the first and second regions 218 have a material with a smaller lattice constant than the material in the third region 220, the material in the substrate region 202 will also have a smaller lattice constant than the material in the third region 220. In this way, the material in the third region 220 may experience tensile or compressive strain from a multiplicity of materials and from a multiplicity of abutting regions.

Methods for the fabrication of embodiments of the present invention are described below. A first method is shown in FIGS. 8a-8f. Isolation structures 204 bound a region of the substrate region 202 having a first semiconductor material. A second semiconductor material with a lattice constant different from the lattice constant of the first material is grown over the substrate region 202, forming a strained layer 240 under biaxial stress. The strained layer 240 may have a thickness in the range of about 10 to about 1000 angstroms and is preferably between about 100 angstroms and 160 angstroms. The strained layer 240 may be grown using epitaxial processes such as chemical vapor deposition, ultra-high vacuum chemical vapor deposition, or molecular beam epitaxy. In another method embodiment, the epitaxial growth of strained layer 240 may be performed before the isolation structures 204 are formed.

The first and second semiconductor materials may comprise various elements in combination. In one embodiment, the first semiconductor material may comprise silicon germanium (SiGe) and the second semiconductor material may comprise silicon (Si), causing a tensile strain in the second semiconductor material. In another embodiment, the first semiconductor material may comprise Si and the second material may comprise SiGe, causing a compressive strain in the second semiconductor material. In a further embodiment, the first semiconductor material may comprise Si and the second material may comprise silicon carbon (SiC), causing a tensile strain in the second semiconductor material. In yet another embodiment, the first semiconductor material may comprise SiC and the second material may comprise Si, causing a compressive strain in the second semiconductor material.

A gate dielectric 206 is formed on the strained layer 240. The gate dielectric 206 can be formed by thermal oxidation, steps of oxidation, and optionally nitridation, deposition, or sputtering of a high-K dielectric. A gate electrode 208 is formed on the gate dielectric 206. Spacers 210, comprising one or a multiplicity of dielectric materials, are formed on adjacent sides of the gate dielectric 206 and gate electrode 208. The combination of the gate dielectric 206, gate electrode 208, and spacers 210 comprises a gate stack 209. Recesses 242 between the third region 220 and isolation structures 204 are formed as shown in FIG. 8d by an etching process such as a plasma etch. The recesses 242 may extend vertically down into the substrate region 202 beyond the strained layer 240 to a depth in the range of about 50 to about 1000 angstroms, exposing the underlying first semiconductor material in the substrate region 202.

Figure 8A:
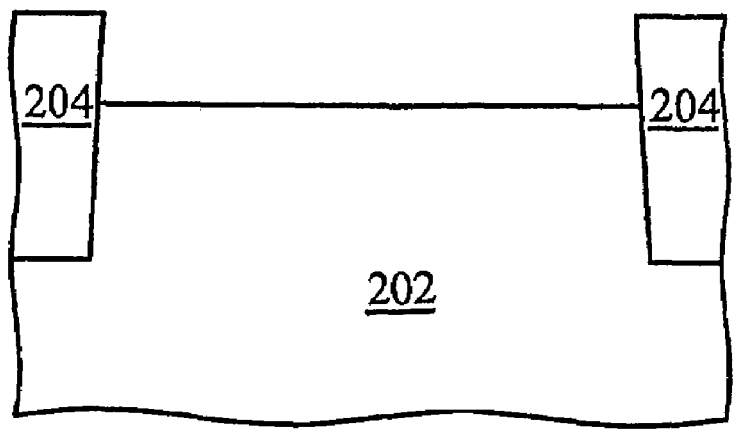
FIGS. 8a-8f are cross-sectional views illustrating a method for manufacturing a transistor in accordance with an illustrative embodiment of the present invention.
Figure 8B:
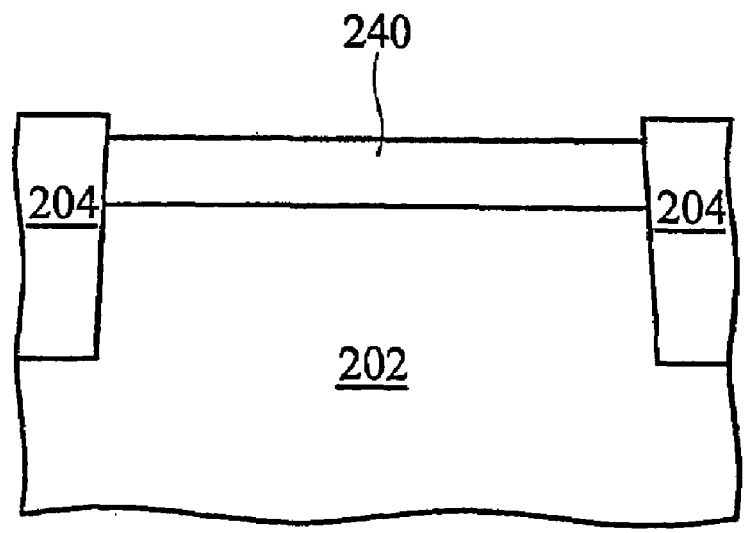
Figure 8C:
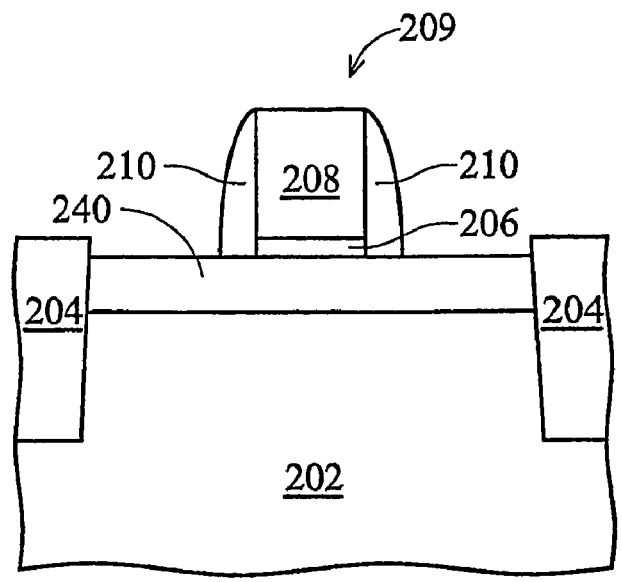
Figure 8D:
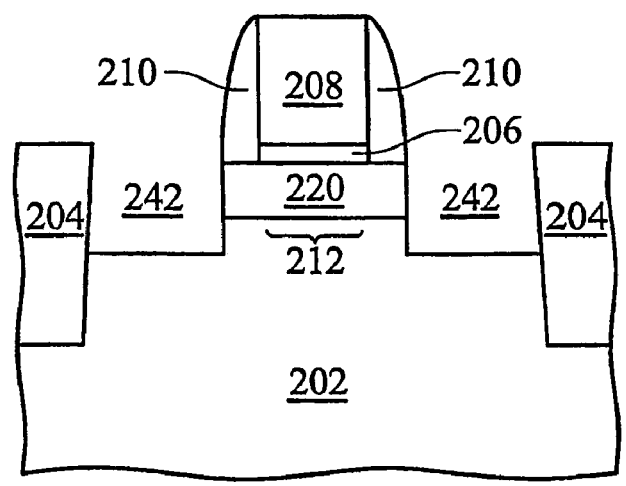
Figure 8E:
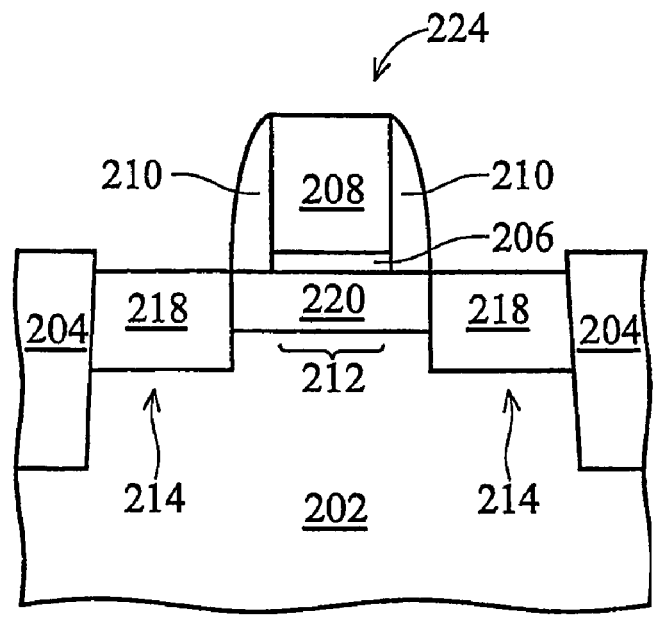
Figure 8F:
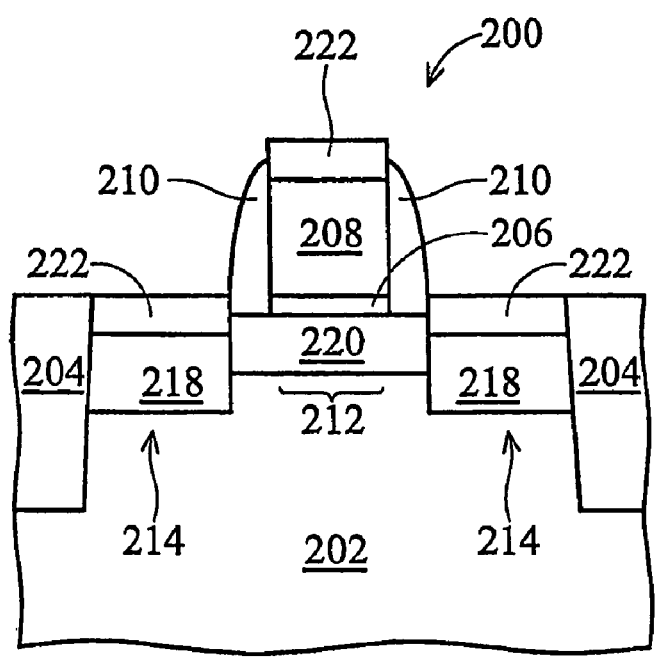

The first semiconductor material is grown in the recesses 242 by selective epitaxy forming first and second regions 218 as shown in FIG. 8e. The first semiconductor material may be in-situ doped as grown, forming source/drain regions 214 over the substrate region 202. The first semiconductor material may be undoped as grown whereby source/drain regions 214 are formed by ion implantation, such as plasma immersion ion implantation, for example.

It should be noted that the transistor 224 of FIG. 8e is the same as the transistor shown in FIG. 5b. Forming conductive regions 222 in the source/drain regions 214 and gate electrode 208, using a conductive material such as metal, a metallic silicide, or a metallic nitride, results in the strained channel transistor 200 of the first embodiment shown in FIG. 8f and FIG. 5a.

Figure 9A:
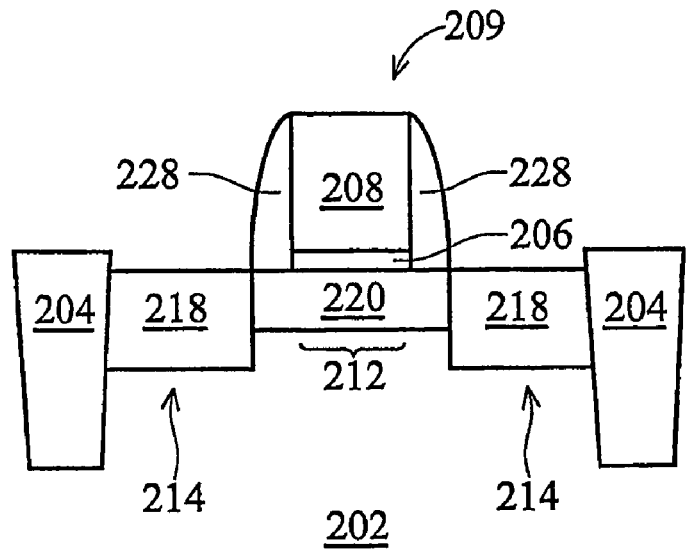
FIGS. 9a-9c are cross-sectional views illustrating portions of a method for manufacturing a transistor in accordance with another illustrative embodiment of the present invention.
Figure 9B:
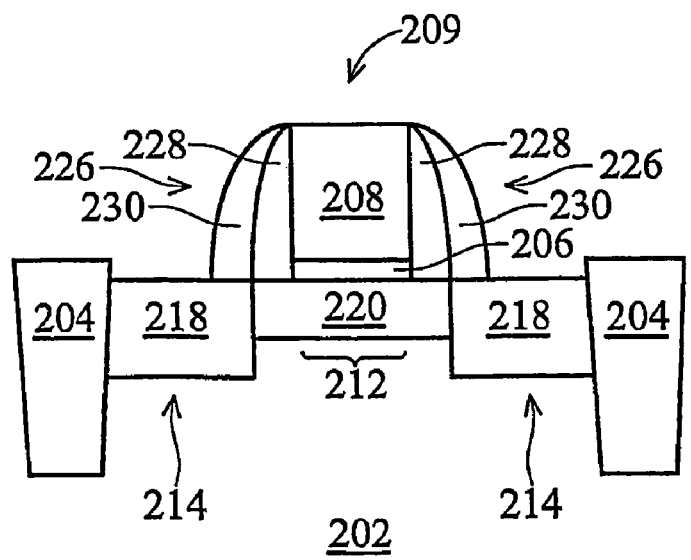
Figure 9C:
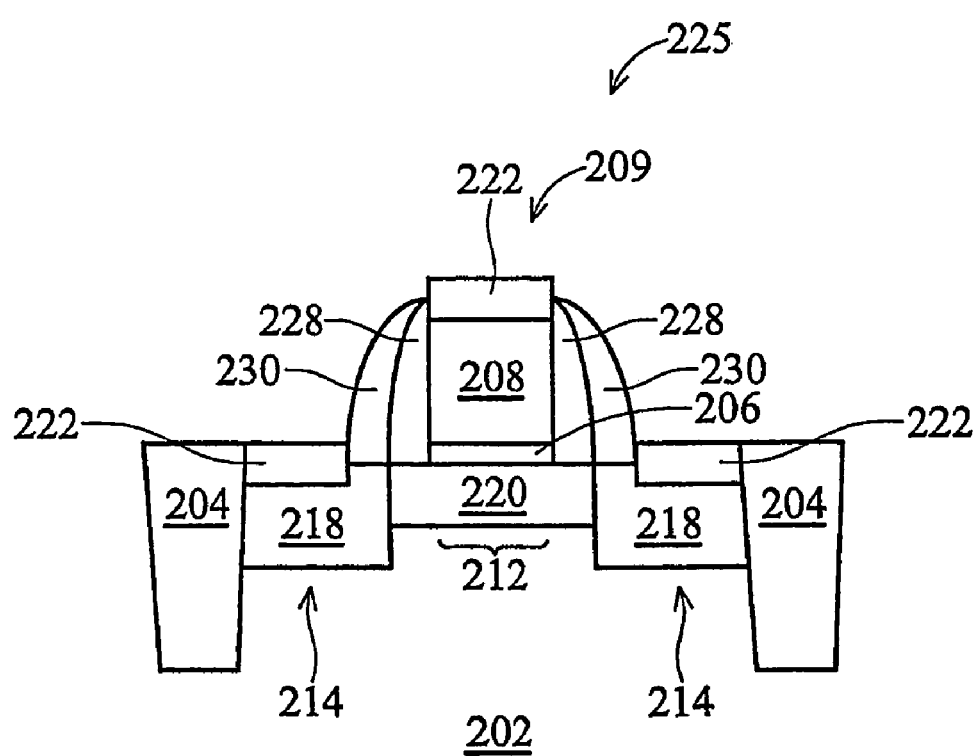

In accordance with a method of the second embodiment of the present invention, the strained channel transistor 225 of FIG. 6 is initially formed using the method shown in FIGS. 8a-8e, with several differences. The substrate region 202 and the first and second regions 218 in the method of the second embodiment comprise SiC. Another difference is that the spacers 210 of FIG. 8e in the method of the first embodiment are instead liners or thin spacers 228 in the method of the second embodiment. FIG. 9a shows FIG. 8e with thin spacers 228 formed on adjacent sides of the gate dielectric 206 and gate electrode 208. A dielectric material 230 forms a spacer body on the thin spacers 228, creating composite spacers 226 as shown in FIG. 9b. Conductive regions 222 may be formed in portions of the source/drain regions 214 and gate electrode 208 resulting in the transistor 225 of the second embodiment shown in FIG. 9c and FIG. 6.

Figure 10A:
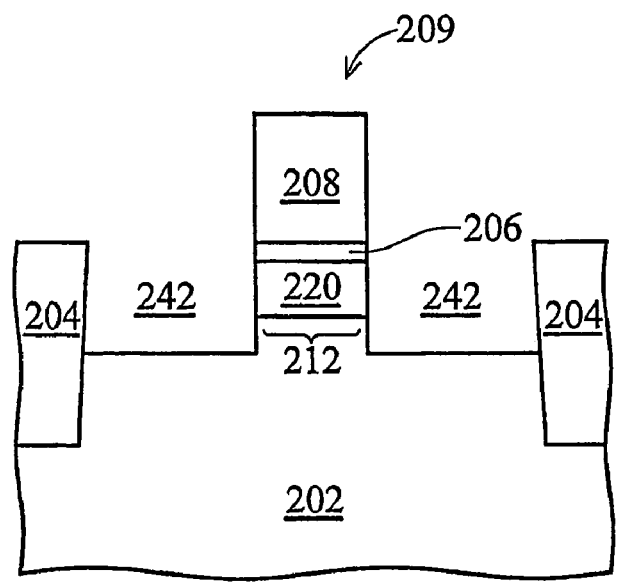
FIGS. 10a-10d are cross-sectional views illustrating portions of a method for manufacturing a transistor in accordance with yet another illustrative embodiment of the present invention.

In accordance with the third illustrative embodiment, a method comprises the steps illustrated in FIGS. 8a and 8b as described above. However, the substrate region 202 of the third embodiment comprises Si and the strained layer 240 is SiC under tensile strain. A gate electrode 208 is formed over a gate dielectric 206, the gate dielectric 206 having been formed over the strained layer 220 as shown in FIG. 10a. A selective plasma etch forms recesses 242 in portions of the strained SiC layer 240 and portions of the Si substrate region 202.

Figure 10B:
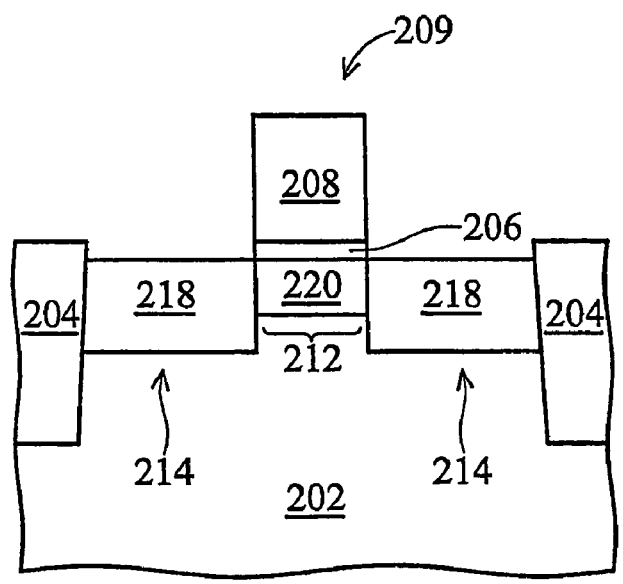

As shown in FIG. 10b, the third material is grown in the first and second regions 218. The third material may be a material with a lattice constant greater than the lattice constant of SiC. The third region 220 abuts the first and second regions 218 at junctions substantially vertically aligned with edges of the gate dielectric 206. Because the Si material in the substrate region 202 has a lattice constant greater than SiC and the third material in the first and second regions 218 has a lattice constant greater than SiC, the SiC in the third region 220 experiences stress from adjacent regions and underlying regions. Surrounding the third region 220 with stressors underneath and on adjacent sides, the SiC material is less likely to experience stress relief during subsequent fabrication steps, thereby maintaining features that enhance transistor performance.

Figure 10C:
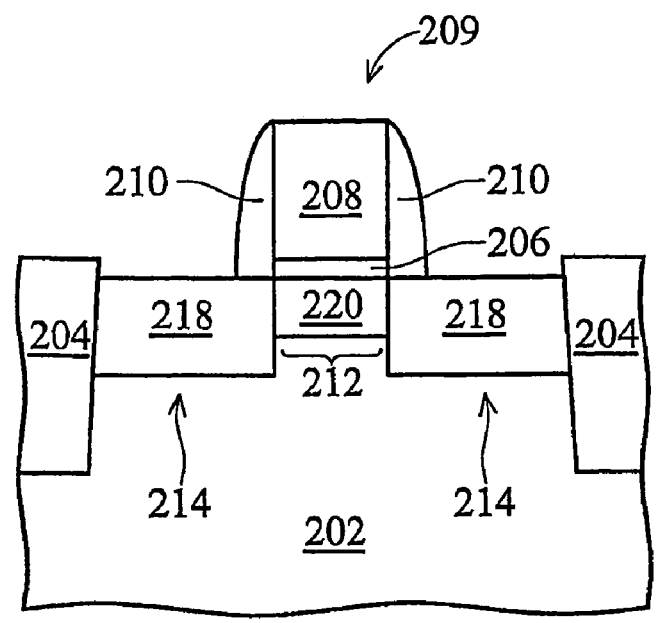
Figure 10D:
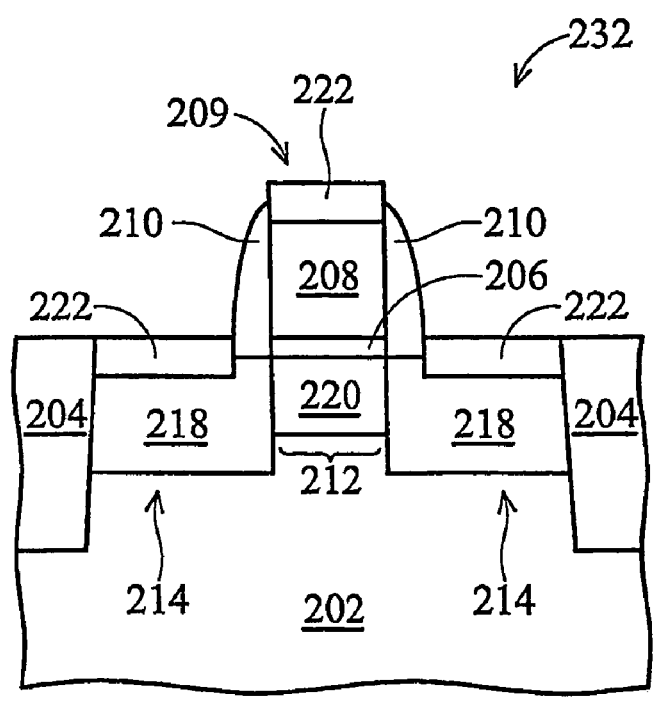

Spacers 210 formed on adjacent sides of the gate electrode 208 and gate dielectric 206 form a gate stack 209 as shown in FIG. 10c. Forming conductive regions 222 over the source/drain regions 214 and gate electrode 208 as shown in FIG. 10d, results in the transistor 232 of the third illustrative embodiment also shown in FIG. 7.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A transistor structure comprising:
   a substrate having a strained layer, the substrate comprising a first semiconductor material having a first lattice constant, the strained layer comprising a second semiconductor material different from the first semiconductor material and having a second lattice constant;
   a strained channel region in the strained layer, wherein the strained channel region is substantially parallel to the major surface of the substrate;
   source and drain regions oppositely adjacent the strained layer, wherein a portion of the source and drain regions oppositely adjacent the strained layer comprises the first semiconductor material, at least a portion of the first semiconductor material in the source and drain regions being located immediately adjacent the strained layer in a direction substantially parallel to the major surface of the substrate, a continuous layer of the first semiconductor material being subjacent the strained layer and extending below the source and drain regions;
   a gate dielectric layer overlying the strained channel region; and
   a gate electrode overlying the gate dielectric layer.

2. The transistor structure of claim 1, wherein the first lattice constant is larger than the second lattice constant.

3. The transistor structure of claim 2, wherein the first semiconductor material comprises silicon and germanium, and the second semiconductor material comprises silicon.

4. The transistor structure of claim 1, wherein the first semiconductor material has a germanium mole fraction in the range of about 0.1 to about 0.9.

5. The transistor structure of claim 2, wherein the first semiconductor material comprises silicon, and the second semiconductor material comprises silicon and carbon.

6. The transistor structure of claim 1, wherein the first lattice constant is smaller than the second lattice constant.

7. The transistor structure of claim 6, wherein the first semiconductor material comprises silicon and carbon, and the second semiconductor material comprises silicon.

8. The transistor structure of claim 6, wherein the first semiconductor material comprises silicon, and the second semiconductor material comprises silicon and germanium.

9. The transistor structure of claim 1, wherein the strained channel region has a thickness in the range of about 10 to about 1000 angstroms.

10. The transistor structure of claim 1, further comprising spacers adjacent to the gate electrode, the spacers having a spacer width, the gate electrode having a gate length, and the strained channel region having a length larger than the gate length and smaller than or equal to the sum of the gate length and twice the spacer width.

11. The transistor structure of claim 1, wherein a portion of the strained channel region is under tensile strain in the source-to-drain direction.

12. The transistor structure of claim 11, wherein the magnitude of the tensile strain is about 0.1% to about 2%.

13. The transistor structure of claim 1, wherein the strained channel region is under compressive strain in the source-to-drain direction.

14. The transistor structure of claim 13, wherein the magnitude of the compressive strain is about 0.1% to about 2%.

15. The transistor structure of claim 1, wherein the gate dielectric layer has a relative permittivity greater than about 5.

16. The transistor structure of claim 1, wherein the gate dielectric layer has a thickness in the range of about 3 to about 100 angstroms.

17. The transistor structure of claim 1, wherein the strained channel region has a length of about 50 angstroms to about 5000 angstroms.

18. The transistor structure of claim 1, wherein the source and drain regions are strapped by a conductive material.

19. The transistor structure of claim 18, wherein the conductive material is selected from a group consisting essentially of a metal, a metal silicide, a metal nitride, a doped poly-crystalline silicon, a doped poly-crystalline silicon-germanium, and a combination thereof.

20. A transistor structure comprising:
   a substrate having a strained layer, the substrate comprising a first semiconductor material having a first lattice constant, the strained layer along an upper surface of the substrate and comprising a second semiconductor material having a second lattice constant;
   a strained channel region in the strained layer and not extending beyond the strained layer along an axis that is substantially parallel to the major surface of the substrate;
   source and drain regions oppositely adjacent the strained layer, top portions of the source and drain regions comprising a third semiconductor material with a third lattice constant, the third semiconductor material being different than the second semiconductor material, the strained layer being on a continuous layer of the first semiconductor material wherein the first semiconductor material extends below the source and drain regions;
   a gate dielectric layer directly on the strained layer; and
   a gate electrode overlying the gate dielectric layer.

21. The transistor structure of claim 20, wherein the first lattice constant is larger than the second lattice constant, and the third lattice constant is larger than the second lattice constant.

22. The transistor structure of claim 21, wherein the first and third semiconductor materials comprise silicon and germanium, and the second semiconductor material comprises silicon.

23. The transistor structure of claim 21, wherein the first and third semiconductor materials comprise silicon, and the second semiconductor material comprises silicon and carbon.

24. The transistor structure of claim 20, wherein the first lattice constant is smaller than the second lattice constant, and the third lattice constant is smaller than the second lattice constant.

25. The transistor structure of claim 24, wherein the first and third semiconductor materials comprise silicon and carbon, and the second semiconductor material comprises silicon.

26. The transistor structure of claim 24, wherein the first and third semiconductor materials comprise silicon, and the second semiconductor material comprises silicon and germanium.

27. The transistor structure of claim 20, wherein the strained channel region has a thickness in the range of about 10 to about 1000 angstroms.

28. The transistor structure of claim 20, wherein the first semiconductor material and the third semiconductor material are the same.

29. The transistor structure of claim 20, wherein the strained channel region is under tensile strain in the source-to-drain direction.

30. The transistor structure of claim 29, wherein the magnitude of the tensile strain is about 0.1% to about 2%.

31. The transistor structure of claim 20, wherein the strained channel region is under compressive strain in the source-to-drain direction.

32. The transistor structure of claim 31, wherein the magnitude of the compressive strain is about 0.1% to about 2%.

33. The transistor structure of claim 20, wherein the gate dielectric layer has a relative permittivity greater than about 5.

34. The transistor structure of claim 20, wherein the gate dielectric layer has a thickness in the range of about 3 to about 100 angstroms.

35. The transistor structure of claim 20, wherein the source and drain regions are strapped by a conductive material.

36. The transistor structure of claim 35, wherein the conductive material is selected from a group consisting essentially of a metal, a metal silicide, a metal nitride, a doped poly-crystalline silicon, a doped poly-crystalline silicon-germanium, and a combination thereof.

* * * * *

UNITED STATES PATENT AND TRADEMARK OFFICE
CERTIFICATE OF CORRECTION

PATENT NO. : 7,335,929 B2  Page 1 of 1
APPLICATION NO. : 10/967917
DATED : February 26, 2008
INVENTOR(S) : Lin et al.

It is certified that error appears in the above-identified patent and that said Letters Patent is hereby corrected as shown below:

On the Title Page, Section (56) References Cited, U.S. PATENT DOCUMENTS, Page 1, column 2, 1st entry, delete "12/1999" and insert --12/1991--.

In Col. 2, line 16, delete "Muthy" and insert --Murthy--.

Signed and Sealed this

Third Day of June, 2008

JON W. DUDAS
*Director of the United States Patent and Trademark Office*